United States Patent
Leung et al.

(10) Patent No.: US 7,144,638 B2
(45) Date of Patent: Dec. 5, 2006

(54) ORGANIC LIGHT-EMITTING DIODE AND MATERIAL APPLIED THERETO

(75) Inventors: Man-Kit Leung, Taipei (TW); Kuei-Hui Yang, Taipei (TW); Chi-Chih Liao, Taipei (TW); Hung-Lin Chen, Pingtung (TW); Yung-Chih Lee, Sanchung (TW); Yi-Meen Chou, Nantou (TW); Tzu-Chin Tang, Hsinshu (TW)

(73) Assignee: RiTdisplay Corporation, Hsinchu (TW)

( * ) Notice: Subject to any disclaimer, the term of this patent is extended or adjusted under 35 U.S.C. 154(b) by 49 days.

(21) Appl. No.: 11/112,922

(22) Filed: Apr. 22, 2005

(65) Prior Publication Data

US 2005/0236605 A1    Oct. 27, 2005

Related U.S. Application Data

(62) Division of application No. 10/693,013, filed on Oct. 23, 2003, now Pat. No. 6,906,340.

(30) Foreign Application Priority Data

Oct. 25, 2002    (TW) ............................ 91125125 A

(51) Int. Cl.
*H01J 63/04*    (2006.01)

(52) U.S. Cl. .................. 428/690; 428/917; 313/506

(58) Field of Classification Search ................ 313/504, 313/506; 428/689, 690, 697, 917; 257/40, 257/103

See application file for complete search history.

(56) References Cited

U.S. PATENT DOCUMENTS

| | | | |
|---|---|---|---|
| 6,589,673 B1* | 7/2003 | Kido et al. ................. | 428/690 |
| 6,841,932 B1* | 1/2005 | Aziz et al. ................. | 313/503 |
| 6,885,149 B1* | 4/2005 | Parthasarathy et al. ..... | 313/504 |
| 2005/0230665 A1* | 10/2005 | Thompson .................. | 252/500 |

\* cited by examiner

*Primary Examiner*—Minh-Loan Tran
(74) *Attorney, Agent, or Firm*—J.C. Patents

(57) ABSTRACT

An organic light-emitting diode comprises an anode, an organic electroluminescent layer, a metal doped layer, and a cathode, in sequence, on a substrate; wherein the metal doped layer comprises an organic compound represented by the formula (1) doped with a metal.

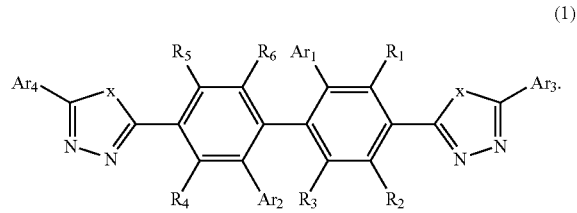

(1)

10 Claims, 4 Drawing Sheets

ORGANIC LIGHT-EMITTING DIODE AND MATERIAL APPLIED THERETO

CROSS-REFERENCE TO RELATED APPLICATION

This application is a divisional application of, and claims the priority benefit of U.S. application Ser. No. 10/693,013 filed on Oct. 23, 2003, now U.S. Pat. No. 6,906,340 which claims the priority benefit of Taiwan application Serial No. 91125125, filed on Oct. 25, 2002.

BACKGROUND OF THE INVENTION

1. Field of the Invention

The present invention relates to an organic light-emitting diode and a material applied thereto, and more particularly to an organic light-emitting diode having low driving voltage and a material applied thereto.

2. Description of the Related Art

Because of low weight and high efficiency, displays, such liquid crystal displays, have been widely developed. However, liquid crystal displays have some problems, such as view angle, speed, driving power and color. More particularly, liquid crystal displays cannot be fabricated with large size.

To date, organic light-emitting diode displays have gradually overcome the size issue.

The organic light-emitting diodes perform display by using organic electroluminescent material. The diode includes two electrodes and an organic functional layer between the electrodes. The organic functional layer includes small molecule OLED (SM-OLED) and polymer light-emitting device (PLED). When a voltage or current is applied to the diode, holes from the anode will recombine with electrons form the cathode within the organic electroluminescent layer and generate excitons. When the excitons release energy and are back to the ground state, a portion of energy generated therefrom will transfer into photons.

In Applied Physics Letters, Vol. 51, No. 12, pp 913–915 (1987), C. W. Tang and S. A. VanSlyke disclosed a double-layer organic light-emitting diode, which includes a pair of electrodes, an organic functional layer and a hole or electron transporting layer. When electrons and holes are supplied by the electrodes and go through the electron or hole transporting layer, they combine within the organic electroluminescent layer and generate photons. The colors of light generated form the diode depend on the organic electroluminescent material.

In Toppan Printing Co. (cf, 51st periodical meeting, Society of Applied Physics, Preprint 28a-PB-4, p. 1040) and Pioneer Co. (cf, 54st periodical meeting, Society of Applied Physics, Preprint 29p-2c-15, p 1127), the cathode is Li and Al can reduce the driving voltage of OLED and improve the brightness thereof.

In JP. Pat. No. 10270171 and EP. Pat. No. 1089361, an electron injection layer formed by co-evaporation of a metal having a low work function and an organic compound having electron withdrawing group can effectively reduce the driving voltage of OLED.

However, in prior art technology there is limitation by using the cathode is Li and Al to reduce the driving voltage. Although the electron injection layer formed by co-deposition of a metal having a low work function and an organic compound having electron withdrawing group can reduce the driving voltage of OLED, the stability and efficiency of the diodes are still not enough.

SUMMARY OF THE INVENTION

Therefore, the object of the present invention is to provide an organic light-emitting diode and a material thereof for reducing driving voltage.

Another object of the present invention is to provide an organic light-emitting diode and a material thereof for serving an organic light-emitting diode having high stability and efficiency.

The present invention discloses an organic light-emitting diode, which comprises a transparent substrate; an anode disposed on the transparent substrate; at least one organic functional layer disposed on the anode; a cathode disposed on the organic functional layer and a metal doped layer disposed between the cathode and the organic functional layer, wherein the metal doped layer comprises an organic compound represented by a formula (1) doped with a metal:

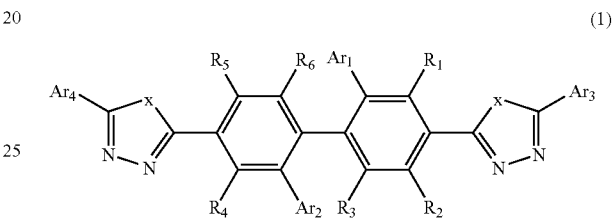

(1)

wherein $R_1$~$R_6$ are a hydrogen, substituted or unsubstituted alkyl, substituted or unsubstituted cycloalkyl, substituted or unsubstituted alkyloxy, substituted or unsubstituted alkenyl, substituted or unsubstituted amino, substituted or unsubstituted aromatic hydroxyl, substituted or unsubstituted polycyclic aromatic or substituted or unsubstituted aromatic alkyl; $Ar_1$~$Ar_4$ are substituted or unsubstituted aromatic hydroxyl, substituted or unsubstituted polycyclic aromatic, substituted or unsubstituted aromatic alkyl or substituted or unsubstituted aromatic heterocyclic; one substitute of the functional groups can be halogen, cyano or nitro; X is oxygen, sulfur, substituted or unsubstituted amino, or substituted or unsubstituted silane.

In addition, the metal doped with the organic compound of formula (1) can be alkali metal, alkaline-earth metal or transition metal and the work function of the metal is preferred no more than 4.5 eV. The metal doped within the organic compound is 0.5%~10%, and it is preferred 1%~3%. Moreover, it is preferred the alkali metal is Li, Na, K, Rb or Cs; the alkaline-earth metal is Be, Mg, Ca, Sr or Ba; and the transition metal is Y, La, Sm or U.

The organic functional layer may comprise, in sequence, a hole injection layer, a hole transporting layer, an organic electroluminescent layer, an electron transporting layer and an electron injection layer.

The organic light-emitting diode and the material thereof of the present invention can reduce the driving voltage and improve stability and efficiency thereof.

In order to make the aforementioned and other objects, features and advantages of the present invention understandable, a preferred embodiment accompanied with figures is described in detail below.

DESCRIPTION OF SOME EMBODIMENTS

Figure 1:
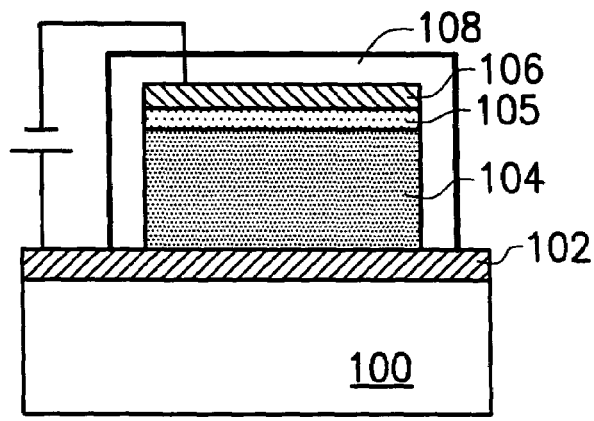
FIG. 1 is a schematic cross-sectional view of a double-layer structure of the organic light-emitting diode of the present invention.

FIG. 1 is a schematic cross-sectional view of a double-layer structure of the organic light-emitting diode of the present invention.

Please referring to FIG. 1, the organic light-emitting diode is a double-layer structure, which comprises a transparent substrate 100, an anode 102, an organic electroluminescent layer 104, a metal doped layer 105, a cathode 106 and a protecting layer 108.

The transparent substrate 100 is, for example, a glass substrate, a plastic substrate or a flexible substrate.

The anode 102 is disposed on the transparent substrate 100, serving for injecting holes into the organic electroluminescent layer 104. Therefore, a preferred work function of the anode 102 is above 4.5 eV. The anode can be indium tin oxide (ITO), tin oxide, gold, silver, Pt or copper.

The organic electroluminescent layer 104 is disposed on the anode 102, which has the property of luminescence and transmits electrons and holes. The colors of the lights generated from the organic electroluminescent layer depend on the property thereof.

The cathode 106 is disposed on the organic electroluminescent layer 104, serving for injecting electrons into the organic electroluminescent layer 104. It is preferred that the cathode 106 has a lower work function. The cathode 106 can be, for example, In, Al, MgIn, MgAl, AlLi or MgAg.

In order to inject electrons from the cathode 106 into the organic electroluminescent layer 104 more efficiently, the organic light-emitting diode of the present invention includes a metal doped layer 105 between the cathode 106 and the organic electroluminescent layer 104 for reducing the driving voltage thereof. In the structure of FIG. 1, the metal doped layer 105 can serve as an electron injection layer. However, in other non-double-layer the metal doped layer 105 does not necessarily serve as an electron injection layer. The composition of the metal doped layer 105 is the feature of the present invention. Detailed descriptions will be mentioned below.

The protecting layer 108 completely covers the organic light-emitting diode and prevents the diode from damage caused by the moisture and oxygen.

The current applied to the organic light-emitting diode can be direct current, alternative current or plus current. In addition, the light generated from the organic light-emitting diode can pass through the anode 102 or reflect from the cathode 106.

Figure 2:
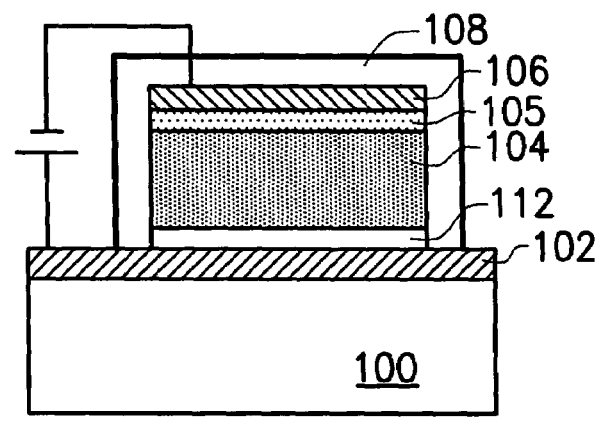
FIG. 2 is a schematic cross-sectional view of a triple-layer structure of the organic light-emitting diode of the present invention.

The organic light-emitting diode of the present invention can also be a triple-layer structure as show in FIG. 2. Please referring to FIG. 2, in addition to the structure shown in FIG. 1, the triple-layer structure further comprises a hole transporting layer 112 disposed between the organic electroluminescent layer 104 and the anode 102.

Figure 3:
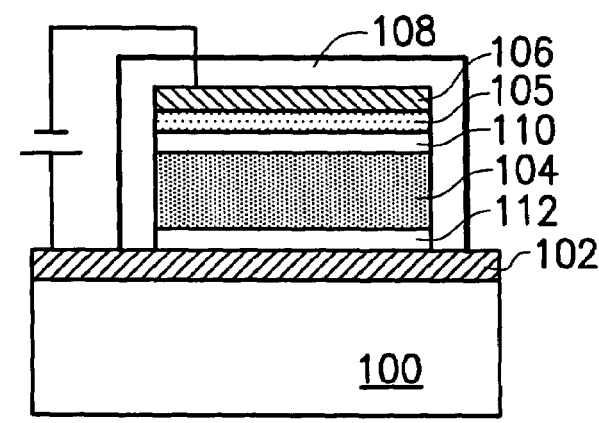
FIGS. 3 and 4 are schematic cross-sectional views of four-layer organic light-emitting diodes of the present invention.
Figure 4:
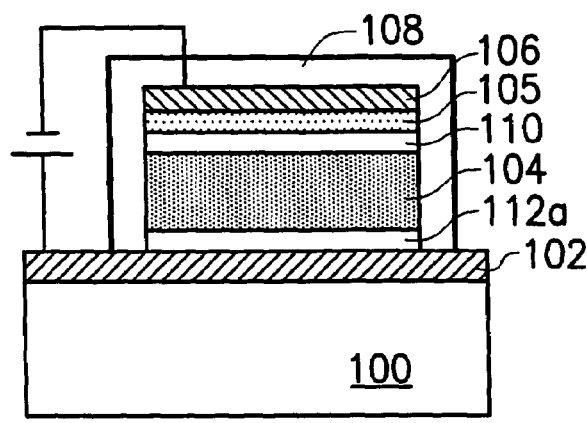

Moreover, the organic light-emitting diode of the present invention can also be a four-layer structure as show in FIGS. 3 and 4. Please referring to FIG. 3, the four-layer structure further comprises a hole transporting layer 112 disposed between the organic electroluminescent layer 104 and the anode 102 and an electron transporting layer 110 disposed between the organic electroluminescent layer 104 and the metal doped layer 105. Please referring to FIG. 4, another four-layer structure further comprises an electron transporting layer 110 between the organic electroluminescent layer 104 and the metal doped layer 105 and a hole injection layer 112a disposed between the organic electroluminescent layer 104 and the anode 102.

Figure 5:
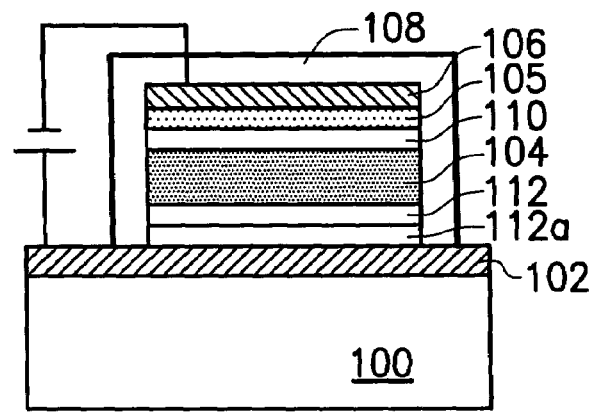
FIG. 5 is a schematic cross-sectional view of a five-layer structure of the organic light-emitting diode of the present invention.

Additionally, the organic light-emitting diode of the present invention can also be a five-layer structure as show in FIG. 5. Please referring to FIG. 5, the five-layer structure further comprises an electron transporting layer 110 disposed between the organic electroluminescent layer 104 and the metal doped layer 105, a hole transporting layer 112 disposed between the organic electroluminescent layer 104 and the anode 102, and a hole injection layer 112a disposed between the hole transporting layer 112 and the anode 102.

Figure 6:
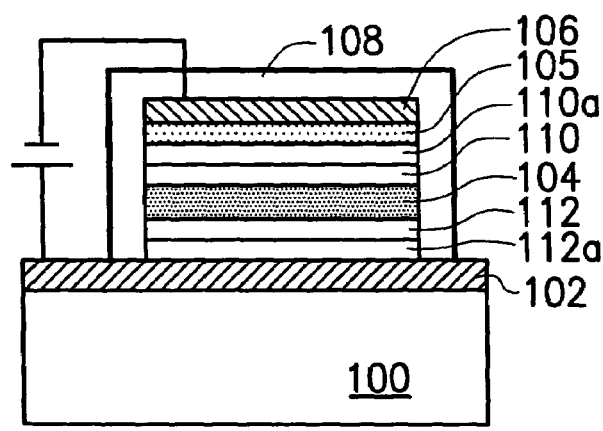
FIG. 6 is a schematic cross-sectional view of a six-layer organic light-emitting diode of the present invention.

Furthermore, the organic light-emitting diode of the present invention can also be a six-layer structure as show in FIG. 6. Please referring to FIG. 6, the six-layer structure comprises an electron transporting layer 110 disposed between the organic electroluminescent layer 104 and the metal doped layer 105, an electron injection layer 110a disposed between the electron transporting layer 110 and the metal doped layer 105, a hole transporting layer 112 disposed between the organic electroluminescent layer 104 and the anode 102, and a hole injection layer 112a disposed between the hole transporting layer 112 and the anode 102.

In the organic light-emitting diode described above, the metal doped layer 105 is the feature of the present invention. The detail descriptions are as shown below.

The metal doped layer 105 of the present invention comprises an organic compound and derivates thereof doped with metal, wherein the organic compound has a high glass transition temperature. The organic compound is represented by formula (1) below.

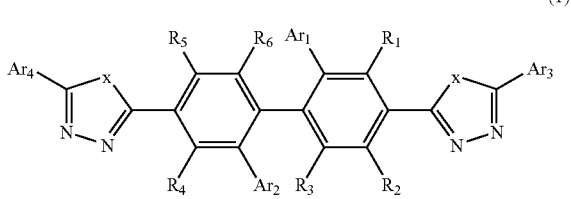

(1)

wherein $R_1$~$R_6$ are a hydrogen, substituted or unsubstituted alkyl, substituted or unsubstituted cycloalkyl, substituted or unsubstituted alkyloxy, substituted or unsubstituted alkenyl, substituted or unsubstituted amino, substituted or unsubstituted aromatic hydroxyl, substituted or unsubstituted polycyclic aromatic or substituted or unsubstituted aromatic alkyl; $Ar_1 \sim Ar_4$ are substituted or unsubstituted aromatic hydroxyl, substituted or unsubstituted polycyclic aromatic, substituted or unsubstituted aromatic alkyl or substituted or unsubstituted aromatic heterocyclic; one substitute of the functional groups can be halogen, cyano or nitro; X is oxygen, sulfur, substituted or unsubstituted amino, or substituted or unsubstituted silane.

In addition, the metal doped with the organic compound of formula (1) can be alkali metal, alkaline-earth metal or transition metal and the work function of the metal is preferred no more than 4.5 eV. The metal doped within the organic compound is 0.5%~10%, and it is preferred 1%~3%. Moreover, it is preferred the alkali metal is Li, Na, K, Rb or Cs; the alkaline-earth metal is Be, Mg, Ca, Sr or Ba; and the transition metal is Y, La, Sm or U.

Following are embodiments of the compounds having high glass transition temperature within the organic light-emitting diode of the present invention, which are a portion of the formula (1), but not limited thereto.

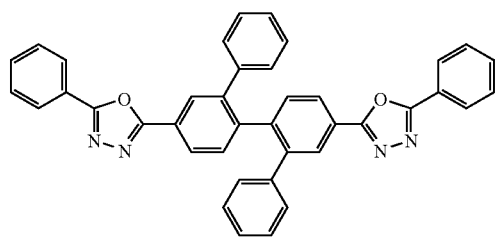

(2)

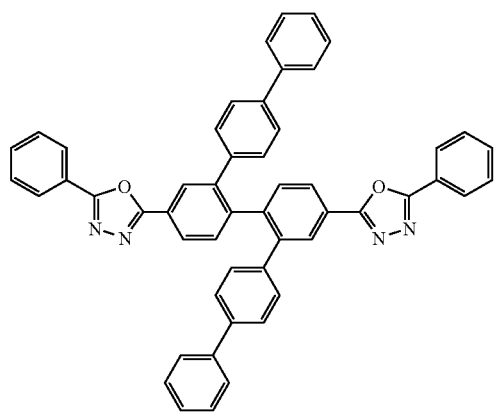

(3)

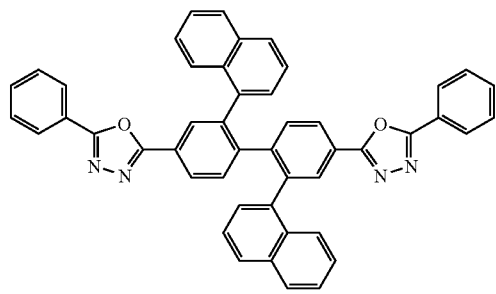

(4)

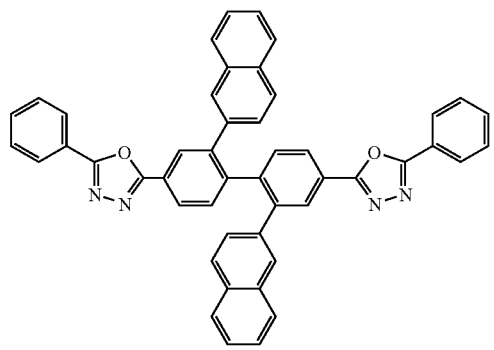

(5)

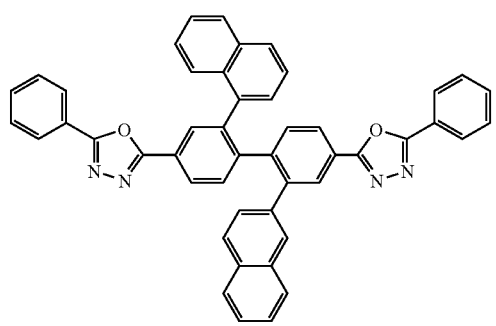

(6)

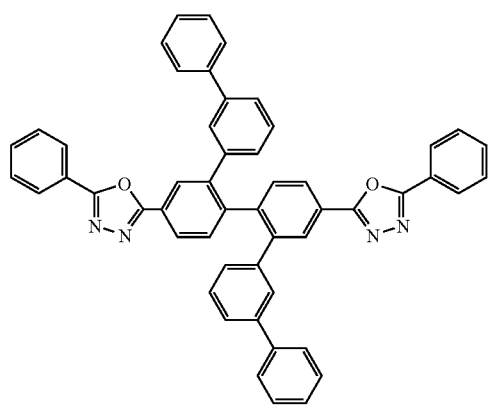

(7)

-continued
(8)
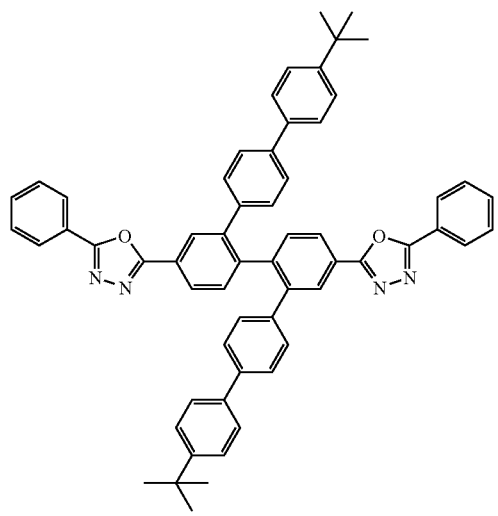
(9)
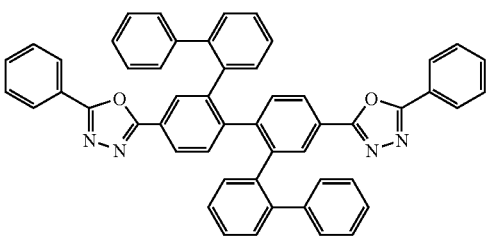
(10)
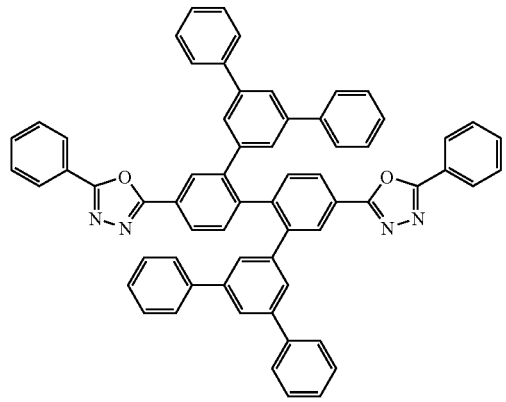
(11)
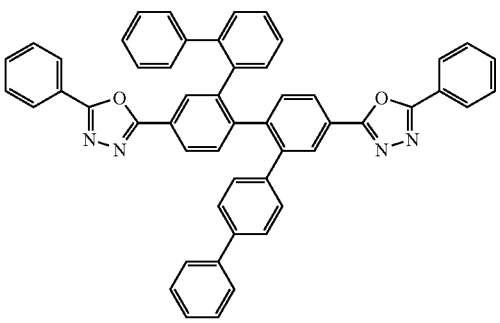
(12)
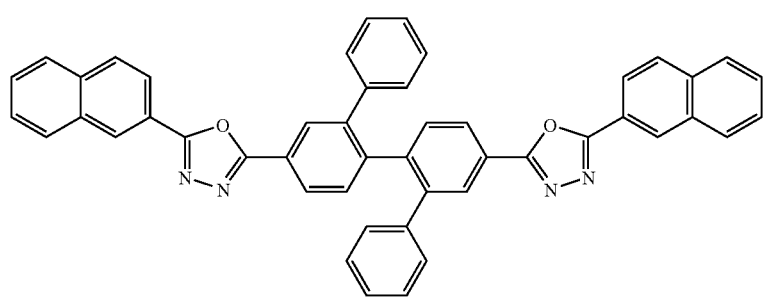
(13)
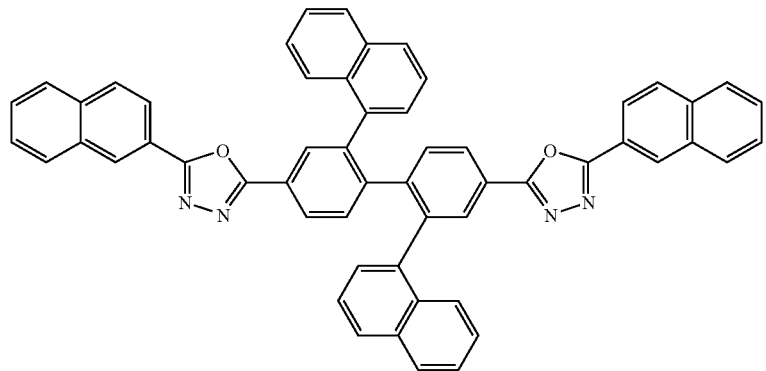

-continued
(14)
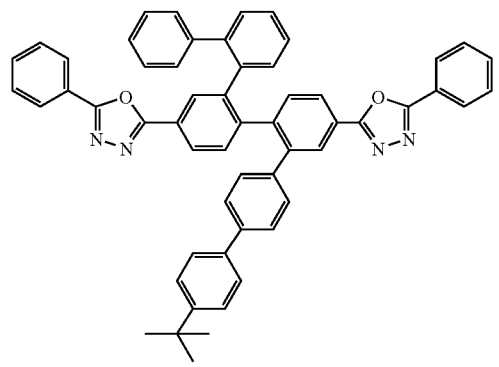
(15)
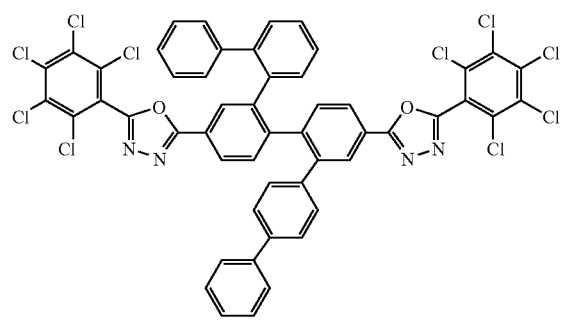
(16)
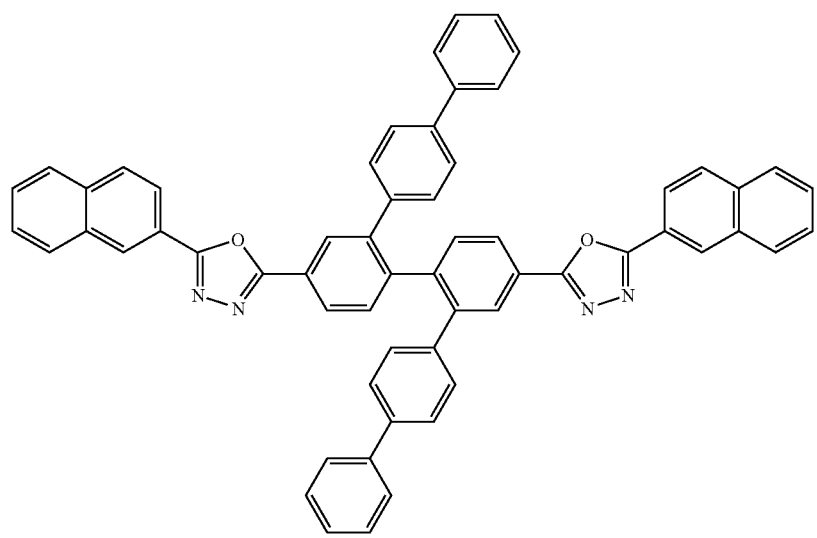
(17)
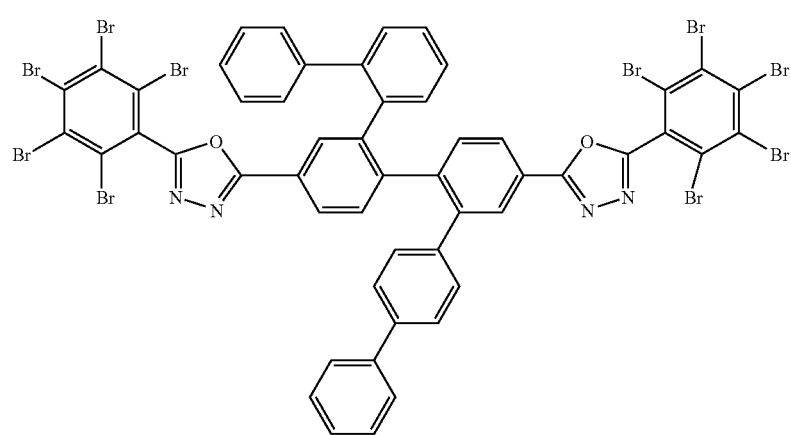

-continued (18)

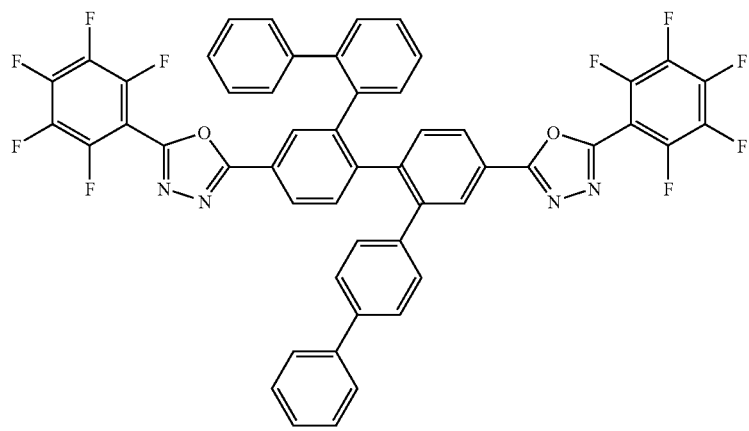

The metal doped layer 105 of the present invention can be formed by co-deposition or sputtering of the compound of formula (1) and the metal. It should be noted that the compound of formula (1) has glass transition temperature higher than 100° C. Moreover, the thickness of the metal doped layer 105 of the present invention can be determined depending on the diode. If the layer is too thin, pin holes will happen; if it is too thick, a higher voltage should be applied. Therefore, it is preferred that the thickness of the organic electroluminescent layer is from about 0.5 nm to about 100 nm.

In addition, the material of the hole transporting layer is not specified. Any material adapted to serve as the hole transporting layer can be used, such as TPD or NPB(α-naphylhenyldiamine) as shown below.

Additionally, the material of the electron transporting layer is not specified. Any material adapted to serve as the electron transporting layer can be used, such as AlQ3, Bebq2, TAZ or PCB as shown below.

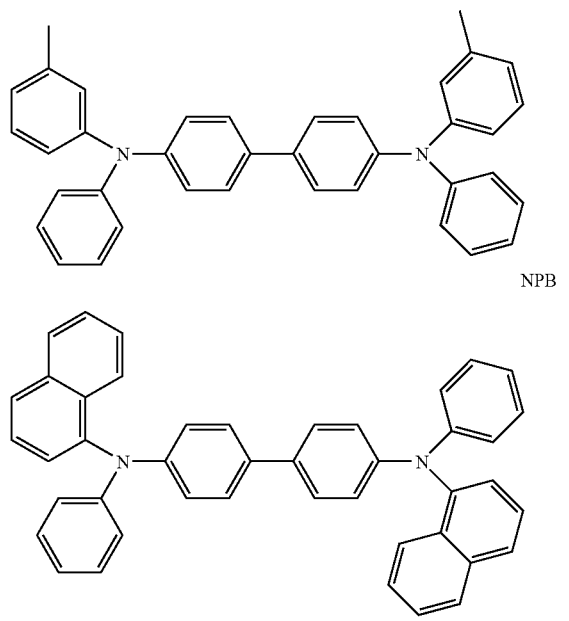

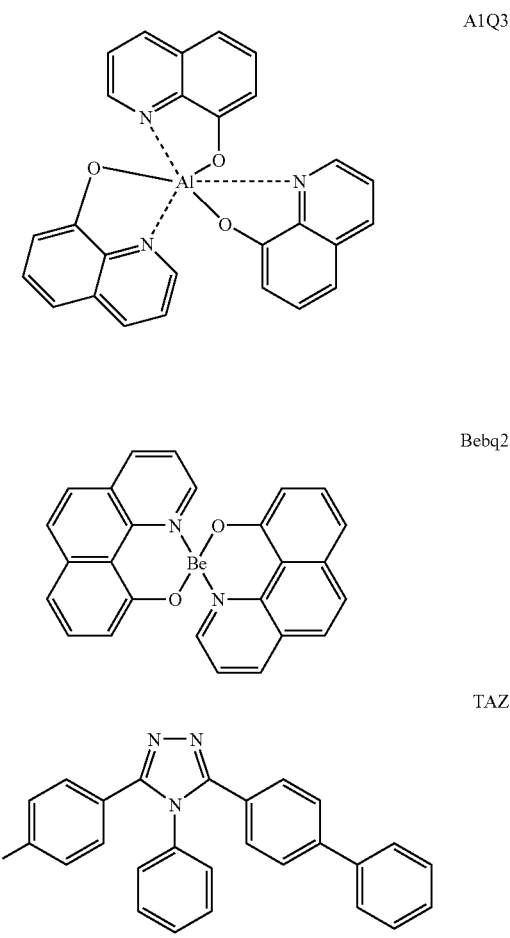

-continued

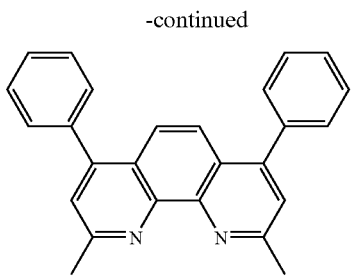

BCP

In the organic light-emitting diode of the present invention, the methods of forming the electron transporting layer, the hole transporting layer, the electron injection layer and the hole injection layer are not specified. Any traditional deposition method, such as vacuum evaporation or spin coating, can be used. Additionally, the thickness of the electron transporting layer, the hole transporting layer, the electron injection layer and the hole injection layer are not specified. Generally, if the films are too thick, a high voltage is required to be applied thereto. Therefore, the thickness of the electron transporting layer, the hole transporting layer, the electron injection layer and the hole injection layer are preferred from about 1 nm to about 1 μm.

Following are examples forming the organic light-emitting diodes. But the scope of the invention is not limited thereto.

The first example is a process flow of forming a four-layer structure of the organic light-emitting diode. Please referring to FIG. 3, an ITO is formed on the substrate 100, serving as the anode 102. Then a hole transporting layer 112 having thickness about 60 nm is formed on the anode 102 by a vacuum deposition under $10^{-5}$ Pa, wherein the hole transporting layer 112 is NPB.

Then the organic electroluminescent layer 104 is formed on the hole transporting layer 112, wherein the organic electroluminescent layer 104 has a thickness about 20 nm. In the embodiment, the material of the organic electroluminescent layer 104 is represented by formula (19) below.

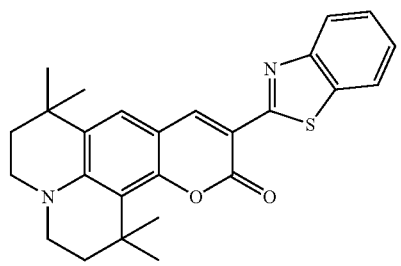

(19)

An AlQ3 layer is formed on the organic electroluminescent layer 104, serving as an electron transporting layer 110, wherein the electron transporting layer 110 has a thickness about 20 nm.

A metal doped layer 105 is then formed on the electron transporting layer 110, wherein the metal doped layer 105 is formed by a co-evaporation of the organic compound and Cs with mole ratio 2:1. The metal doped layer 105 has a thickness about 20 nm.

An Al layer is formed on the metal doped layer 105, serving as the cathode 106, which has a thickness about 100 nm. Finally, a protecting layer 108 is formed, covering the diode. Then, the organic light-emitting diode is completed.

To prove that the organic light-emitting diode having the metal doped layer can substantially reduce the driving voltage and improve efficiency thereof. Two comparative examples are presented below.

In the first comparative example, it has all layers shown in the first example except the metal doped layer 105. It is a prior art structure.

The second comparative example has the same structure as the first example. The difference is the organic compound of the metal doped layer 105 is replaced by one having lower glass transition temperature. The organic compound having lower glass transition temperature is represented by formula (20) below.

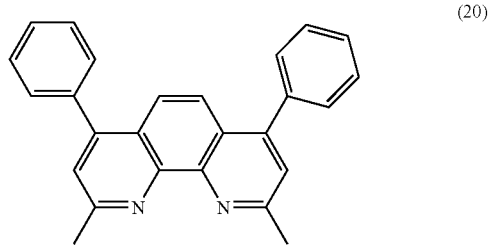

(20)

Figure 7:
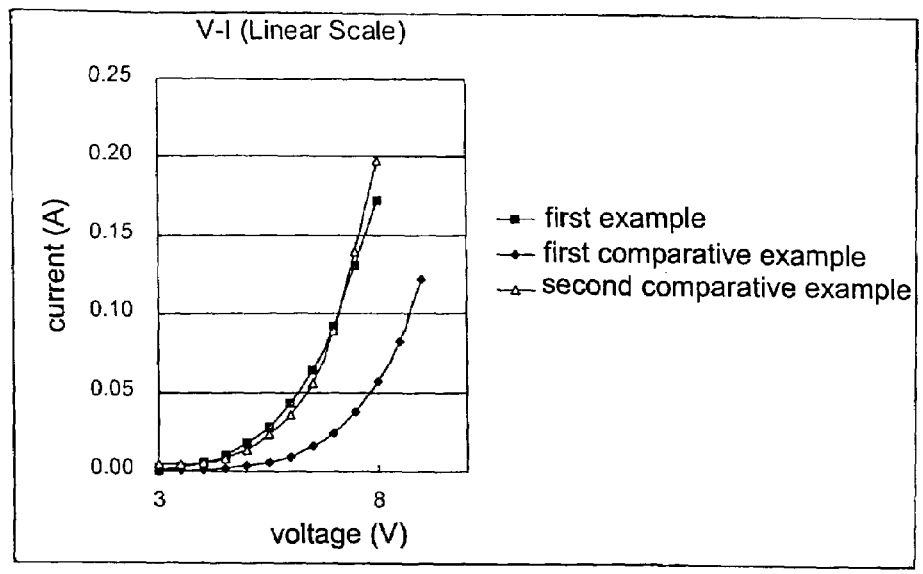
FIG. 7 is an I-V curve showing the test results of the first example, the first comparative example and the second comparative example.

FIG. 7 is an I-V curve showing the test results of the first example, the first comparative example and the second comparative example.

Please referring to FIG. 7, the driving voltage of the organic light-emitting diode of the first example is lower than that of the first comparative example. It shows that the organic light-emitting diode having the metal doped layer can reduce the driving voltage. In the first example, Cs is doped within the compound of formula (1). Compared with the organic light-emitting diode without the metal doped layer, the driving voltage difference is about 2 V.

The organic compound within the second comparative example has a lower glass transition temperature. Comparing the second comparative example and the first example, the organic light-emitting diode having higher glass transition temperature has lower driving voltage.

Figure 8:
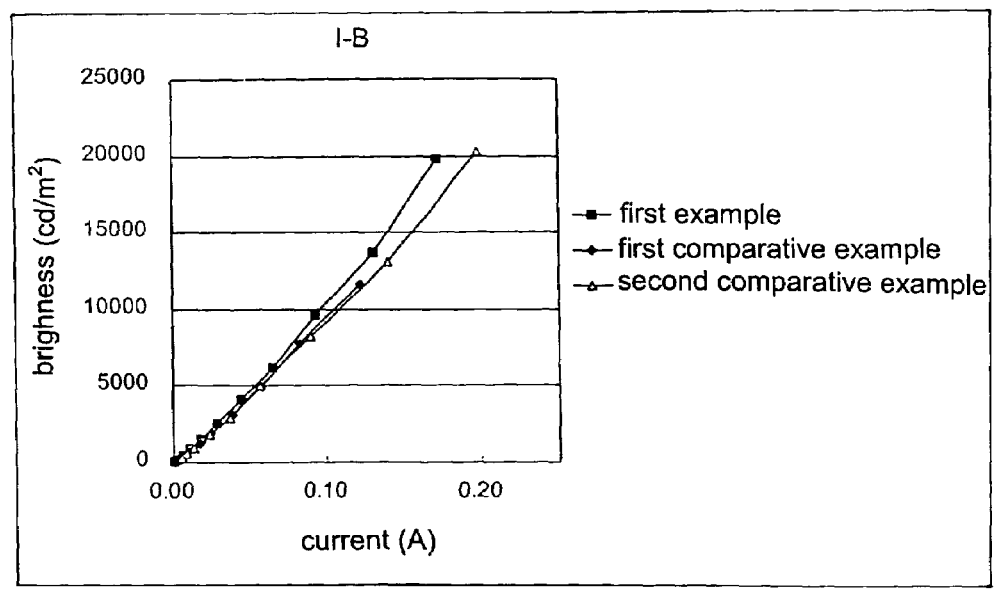
FIG. 8 is a current-brightness figure showing the test results of the first example, the first comparative example and the second comparative example.

FIG. 8 is a current-brightness figure showing the test results of the first example, the first comparative example and the second comparative example.

Please referring to FIG. 8, the organic light-emitting diode of the first example does not reduce the brightness thereof. It shows that the organic light-emitting diode having the metal doped layer can reduce the driving voltage and will not affect the brightness thereof.

Figure 9:
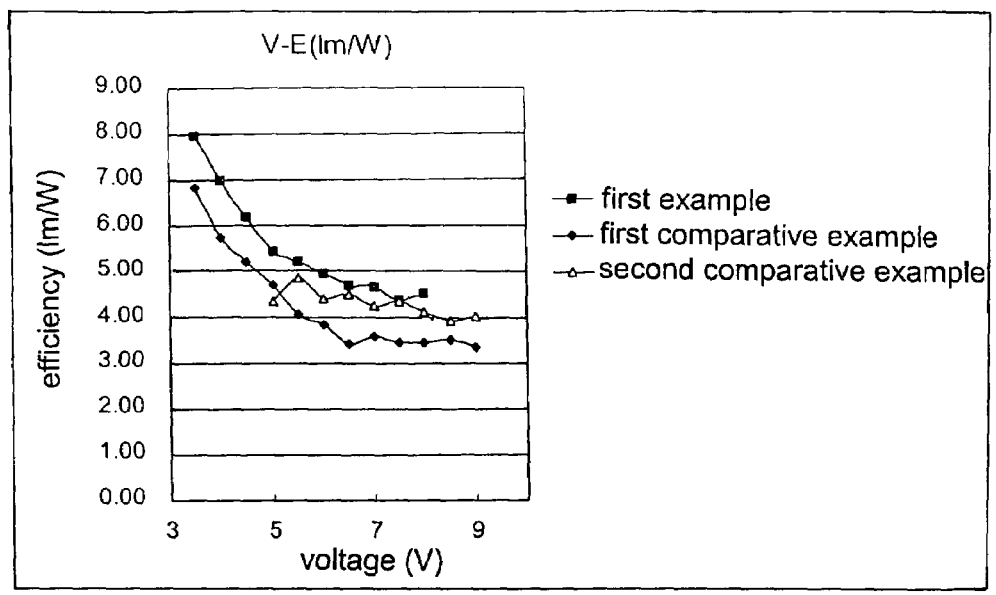
FIG. 9 is a voltage-efficiency figure showing the test results of the first example, the first comparative example and the second comparative example.
Figure 10:
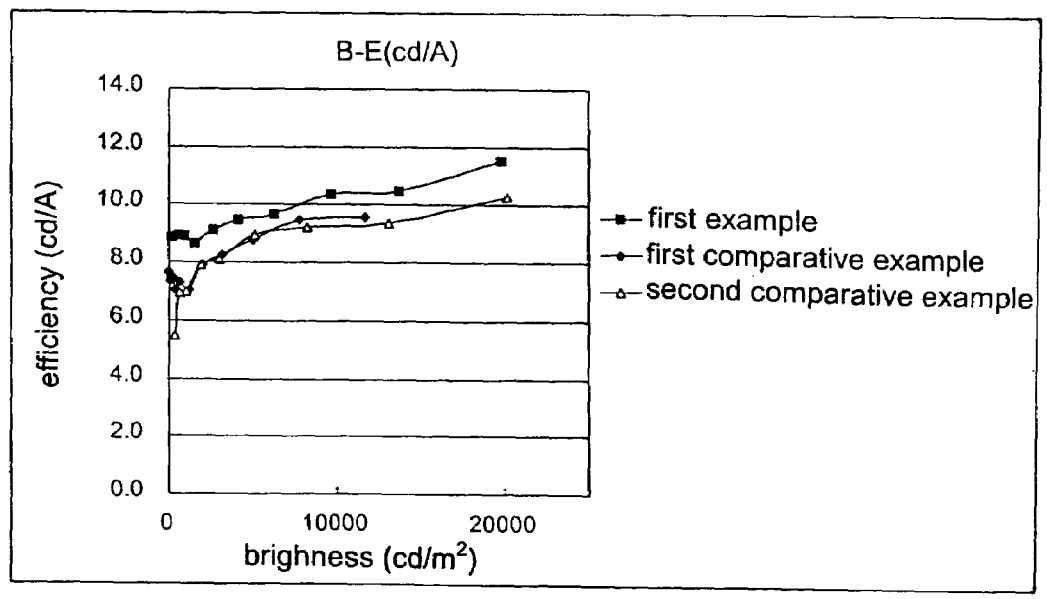
FIG. 10 is a brightness-efficiency figure showing the test results of the first example, the first comparative example and the second comparative example.

FIG. 9 is a voltage-efficiency figure showing the test results of the first example, the first comparative example and the second comparative example. FIG. 10 is a brightness-efficiency figure showing the test results of the first example, the first comparative example and the second comparative example.

Please referring to FIGS. 9 and 10, the organic light-emitting diode of the first example has better efficiency than those of the first and second comparative examples.

The organic light-emitting diode of the present invention has a metal doped layer, which is formed by doping alkali metal, alkaline-earth metal or transition metal in organic compound. Because of the combination of the metal doped layer and the cathode, the driving voltage of the organic light-emitting diode is reduced and the diode efficiency is improved. Moreover, the stability of the organic light-emitting diode having the metal doped layer with high glass transition temperature has better stability.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A material utilized for organic light-emitting diodes, the material comprising an organic compound doped with a metal, the organic compound represented by formula (1) below:

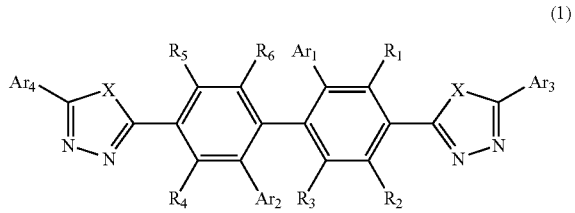

(1)

wherein $R_1$~$R_6$ are a hydrogen, substituted or unsubstituted alkyl, substituted or unsubstituted cycloalkyl, substituted or unsubstituted alkyloxy, substituted or unsubstituted alkenyl, substituted or unsubstituted amino, substituted or unsubstituted aromatic hydroxyl, substituted or unsubstituted polycyclic aromatic or substituted or unsubstituted aromatic alkyl; $Ar_1$~$Ar_4$ are substituted or unsubstituted aromatic hydroxyl, substituted or unsubstituted polycyclic aromatic, substituted or unsubstituted aromatic alkyl or substituted or unsubstituted aromatic heterocyclic; X is oxygen, sulfur, substituted or unsubstituted amino, or substituted or unsubstituted silane.

2. The material utilized for organic light-emitting diodes of claim 1, wherein one substitute of the functional groups is halogen, cyano or nitro.

3. The material utilized for organic light-emitting diodes of claim 1, wherein a glass transition temperature of the organic compound is higher than 100° C.

4. The material utilized for organic light-emitting diodes of claim 1, wherein the metal doped within the organic compound is alkali metal, alkaline-earth metal or transition metal.

5. The material utilized for organic light-emitting diodes of claim 4, wherein the alkali metal is Li, Na, K, Rb or Cs.

6. The material utilized for organic light-emitting diodes of claim 4, wherein the alkaline-earth metal is Be, Mg, Ca, Sr or Ba.

7. The material utilized for organic light-emitting diodes of claim 4, the transition metal is Y, La, Sm or U.

8. The material utilized for organic light-emitting diodes of claim 1, wherein a work function of the metal is no more than 4.5 eV.

9. The material utilized for organic light-emitting diodes of claim 1, wherein the metal doped within the organic compound is 0.5%~10%.

10. The material utilized for organic light-emitting diodes of claim 9, wherein the metal doped within the organic compound is preferred 1%~3%.

* * * * *